US011011490B2

(12) United States Patent
Khazaka et al.

(10) Patent No.: US 11,011,490 B2
(45) Date of Patent: May 18, 2021

(54) ASSEMBLY COMPRISING HYBRID INTERCONNECTING MEANS INCLUDING INTERMEDIATE INTERCONNECTING ELEMENTS AND SINTERED METAL JOINTS, AND MANUFACTURING PROCESS

(71) Applicant: COMMISSARIAT A L'ENERGIE ATOMIQUE ET AUX ENERGIES ALTERNATIVES, Paris (FR)

(72) Inventors: Rabih Khazaka, Saint Remy les Chevreuse (FR); Benoît Thollin, Montbonnot St Martin (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/072,867

(22) PCT Filed: Jan. 26, 2017

(86) PCT No.: PCT/EP2017/051667
§ 371 (c)(1),
(2) Date: Jul. 25, 2018

(87) PCT Pub. No.: WO2017/129687
PCT Pub. Date: Aug. 3, 2017

(65) Prior Publication Data
US 2018/0374813 A1    Dec. 27, 2018

(30) Foreign Application Priority Data

Jan. 26, 2016  (FR) ...................................... 1650583

(51) Int. Cl.
*H01L 23/00*   (2006.01)
*H01L 23/498*  (2006.01)
*H01L 21/48*   (2006.01)

(52) U.S. Cl.
CPC .......... *H01L 24/17* (2013.01); *H01L 21/4846* (2013.01); *H01L 23/49811* (2013.01);
(Continued)

(58) Field of Classification Search
CPC ... H01L 24/17; H01L 24/09; H01L 23/49811; H01L 21/4846; H01L 24/13; H01L 24/16; H01L 24/81
See application file for complete search history.

(56) References Cited

U.S. PATENT DOCUMENTS 5,928,768 A * 7/1999 Ikeda ...................... H01L 23/15
                                                       257/E21.53
8,257,795 B2   9/2012 Lu et al.
(Continued)

FOREIGN PATENT DOCUMENTS

JP    2007-184408 A    7/2007
JP    2007-208082 A    8/2007
(Continued)

*Primary Examiner* — Michele Fan
(74) *Attorney, Agent, or Firm* — BakerHostetler

(57) ABSTRACT

An assembly includes at least one first element comprising at least one first electrical bonding pad; at least one second element comprising at least one second electrical bonding pad; electrical and mechanical interconnect means, wherein the electrical and mechanical interconnect means comprise at least: at least one first intermediate metal interconnect element, on the surface of at least the first electrical bonding pad; at least one sintered joint of metal microparticles or nanoparticles stacked with the first intermediate metal interconnect element; the melting point of the first intermediate metal interconnect element being greater than the sintering temperature of the metal microparticles or nanoparticles. A method for fabricating an assembly is also provided.

14 Claims, 12 Drawing Sheets

(52) U.S. Cl.
CPC ........ *H01L 23/49833* (2013.01); *H01L 24/09* (2013.01); *H01L 24/11* (2013.01); *H01L 24/13* (2013.01); *H01L 24/16* (2013.01); *H01L 24/81* (2013.01); *H01L 2224/05155* (2013.01); *H01L 2224/05644* (2013.01); *H01L 2224/11001* (2013.01); *H01L 2224/11003* (2013.01); *H01L 2224/1132* (2013.01); *H01L 2224/1134* (2013.01); *H01L 2224/1147* (2013.01); *H01L 2224/1184* (2013.01); *H01L 2224/11312* (2013.01); *H01L 2224/11332* (2013.01); *H01L 2224/11462* (2013.01); *H01L 2224/11505* (2013.01); *H01L 2224/11822* (2013.01); *H01L 2224/13078* (2013.01); *H01L 2224/13082* (2013.01); *H01L 2224/13083* (2013.01); *H01L 2224/13144* (2013.01); *H01L 2224/13294* (2013.01); *H01L 2224/13339* (2013.01); *H01L 2224/13639* (2013.01); *H01L 2224/13644* (2013.01); *H01L 2224/13647* (2013.01); *H01L 2224/16058* (2013.01); *H01L 2224/16238* (2013.01); *H01L 2224/16501* (2013.01); *H01L 2224/8184* (2013.01); *H01L 2224/81191* (2013.01); *H01L 2224/81193* (2013.01); *H01L 2224/81203* (2013.01); *H01L 2224/81204* (2013.01); *H01L 2224/81208* (2013.01); *H01L 2924/381* (2013.01)

(56) References Cited

U.S. PATENT DOCUMENTS

| | | | |
|---|---|---|---|
| 2002/0093108 A1 | | 7/2002 | Grigorov |
| 2006/0030069 A1 | * | 2/2006 | Chang ............... H01L 23/49816 438/106 |
| 2007/0182019 A1 | | 8/2007 | Nishimura |
| 2012/0025365 A1 | * | 2/2012 | Haba ................... H01L 21/4853 257/692 |
| 2013/0300004 A1 | * | 11/2013 | Choi ..................... H01L 21/563 257/796 |
| 2013/0307156 A1 | | 11/2013 | Bayerer |
| 2015/0296620 A1 | | 10/2015 | Lee et al. |
| 2017/0012021 A1 | * | 1/2017 | Uzoh ....................... H01L 24/83 |

FOREIGN PATENT DOCUMENTS

| | | | | |
|---|---|---|---|---|
| JP | 2009-224615 A | | 10/2009 | |
| JP | 2009224615 A | * | 10/2009 | ............. H01L 24/81 |
| JP | 2010-272818 A | | 12/2010 | |
| JP | 2010272818 A | * | 12/2010 | ............. H01L 24/14 |

* cited by examiner

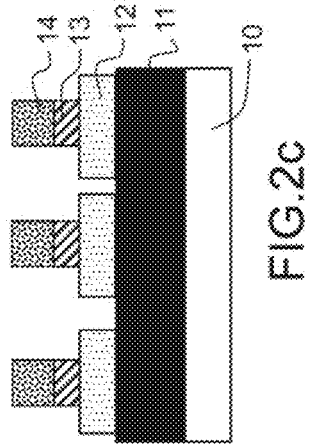
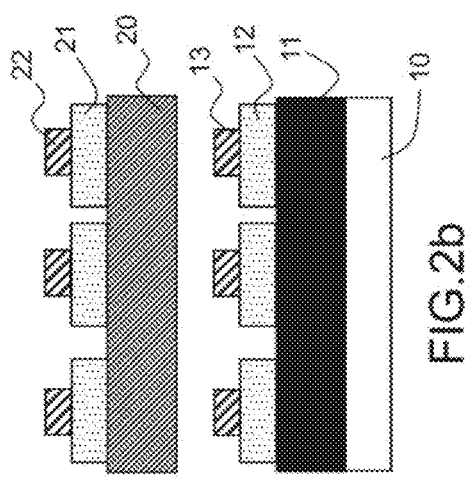
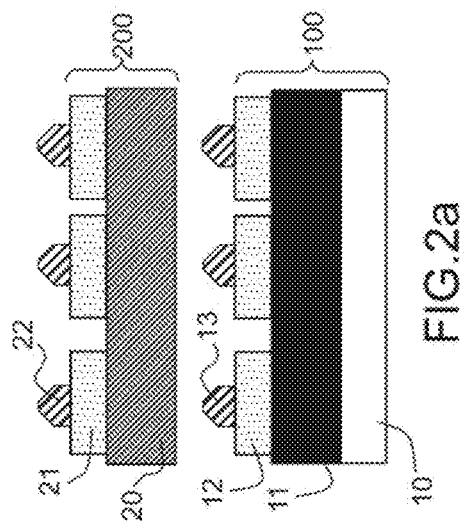
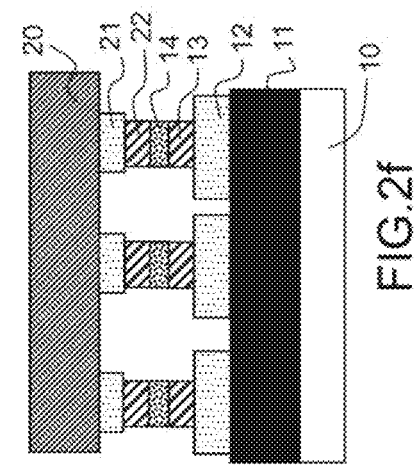
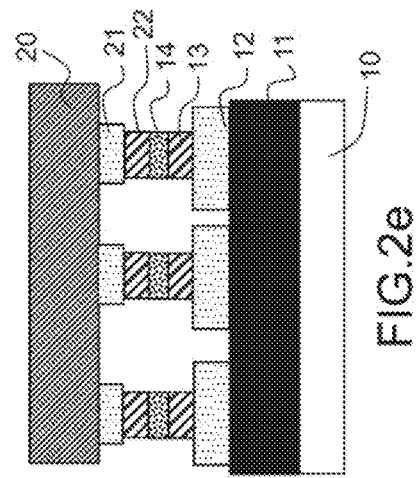
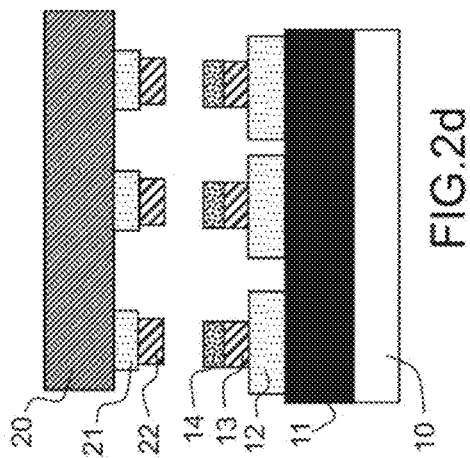

ASSEMBLY COMPRISING HYBRID INTERCONNECTING MEANS INCLUDING INTERMEDIATE INTERCONNECTING ELEMENTS AND SINTERED METAL JOINTS, AND MANUFACTURING PROCESS

CROSS-REFERENCE TO RELATED APPLICATIONS

This application is a National Stage of International patent application PCT/EP2017/051667, filed on Jan. 26, 2017, which claims priority to foreign French patent application No. FR 1650583, filed on Jan. 26, 2016, the disclosures of which are incorporated by reference in their entirety.

FIELD OF THE INVENTION

The field of the invention is that of the 3D assembly of semiconductors comprising electrical interconnects.

BACKGROUND

The 3D assembly solutions are of great interest for various applications in microelectronics and in power electronics. The connections between the chip and the circuit can be produced by different techniques and in particular by wired cabling, commonly called "wire bonding", by ribbon cables or by "flip chip" mounting-type technologies.

Microcabling or wire assembly is the oldest and most widely used technology in the microelectronics industry for producing the interconnect of a "chip" circuit with its environment (package, printed circuit board, hybrid circuit, etc). It can involve "Wedge bonding" or "Ball bonding":

- in the "wedge bonding" technique, a wire, most commonly of aluminum, is fed by the tool (called stylus or needle), then applied to the pad to be soldered. The link between the wire and the zone to be connected is made by combining pressure and ultrasound vibration. This is a "cold" soldering. It is the ultrasound energy which causes a softening of the wire similar to the effect obtained by a temperature rise. The wire is then guided by the tool onto the second pad and a soldering is performed;
- in the "ball bonding" technique, for example, a gold wire passes through a heated capillary tube (100 to 200° C.). The ball formed at the output of the capillary tube (by the discharging of a capacitor or by a hydrogen flame) is soldered onto an output pad of the circuit. The capillary tube is then displaced to perform the second soldering. The wire is torn away by the capillary tube, a new ball is reformed and a new connection can be made.

The advantages of the "flip chip" assemblies are numerous, such as the strong integration, the low strain inductance, and a better discharging of the heat flux generated by the semiconductors.

The production of the interconnects with solder "bumps" is one of the techniques most widely used in "flip chip" assembly, and consists in depositing paste to be soldered on bonding pads, commonly referred to by the person skilled in the art as "pad", located on the circuit or on the electronic component, then in aligning the component and the circuit to match each circuit "pad" with the semiconductor "pad".

The circuit and the substrate are placed in contact and a soldering method is applied that makes it possible to ensure the electrical and mechanical contact between the semiconductor and the substrate. This technique is not practical for all the applications and can have a number of disadvantages such as the need for specific metal layers on the pads to be connected, involving additional methods and, consequently, high costs, the need for a temperature at least equal to the melting point of the solder, and the difficulty in making up a difference of several µm or several tens of µm in height that may be present on some components. Furthermore, the soldering method induces a risk of short circuit that is not inconsiderable when the distances between electrodes are small following the flow of the solder during melting thereof.

Another alternative such as direct sintering of nanoparticles can be used as described in the patent U.S. Pat. No. 8,257,795 B2 "Nanoscale metal paste for interconnect and method of use". It consists in replacing the connection commonly called solder "bump" of the solder "bump" technique with a nanoparticle paste (Ag, Au or Cu) to be sintered. This technology also presents drawbacks such as the need for an appropriate metallization of the pads (Au or Ag but not compatible with the Al very often used as finish for electronic chips). A second disadvantage with this technique is the low height of the joint (generally 10 microns) which can limit the thermomechanical reliability of the joints and the choice of the underfills (encapsulating materials) which have to fill the gaps (more often than not by capillarity).

The interconnect by "stud bump", for its part, consists in using a "ball bonding" wiring machine.

More specifically, a ball of the metal is attached to the pad by the use of the thermosonic or thermocompression techniques. The wire is cut just after the ball forming the "stud bump" form, also called intermediate interconnect element. Next, the "stud bumps" formed on the bonding pad of the semiconductor or on that of the circuit are attached to the other bonding pad by thermocompression. One drawback with this technique is the possibility of having problems of adhesion between the metallization and the "stud bump" in the thermocompression due to the absence or the small thickness of the necessary metal layer. The patent US 2002/0093108 A1 "FLIP CHIP PACKAGED SEMICONDUCTOR DEVICE HAVING DOUBLE STUD BUMPS AND METHOD OF FORMING SAME" makes it possible to avoid this problem by producing "stud bumps" on the circuit and semiconductor side and by then thermocompressing "stud bump" on "stud bump". The second drawback is the need for a pressure and a high temperature to ensure the assembly by thermocompression which is not compatible with pressure-sensitive components. Furthermore, this assembly technique does not make it possible to make up a difference in height of several µm or several tens of µm that may be present on some components following the fabrication method.

SUMMARY OF THE INVENTION

The present invention aims to resolve one or more of the drawbacks of the various techniques mentioned above. It consists in producing hybrid electrical and mechanical interconnects comprising so-called intermediate interconnect elements that can correspond, for example, to "stud bumps" combined with sintered joints obtained for example from a paste or film of metal microparticles or nanoparticles.

More specifically, the subject of the present invention is an assembly comprising:

at least one first element comprising at least one first electrical bonding pad;

at least one second element comprising at least one second electrical bonding pad or a surface metallization;

electrical and mechanical interconnect means;

characterized in that said electrical and mechanical interconnect means comprise:

at least one first intermediate metal interconnect element, on the surface of at least the first electrical bonding pad;

at least one sintered joint of metal microparticles or nanoparticles stacked with said first intermediate metal interconnect element;

the melting point of said first intermediate metal interconnect element being greater than the sintering temperature of said metal microparticles or nanoparticles.

One of the benefits of the present invention lies in the fact that the intermediate interconnect elements are previously defined, and exhibit a temperature resistance which is unaffected by the sintering of the metal microparticles or nanoparticles, making it possible to produce interconnections of heterogeneous stacked elements which ensure the functionalities sought.

According to variants of the invention, the assembly also comprises at least one second intermediate metal interconnect element, on the surface of at least one second electrical bonding pad.

According to variants of the invention, at least one of the elements comprises a semiconductor component.

According to variants of the invention, at least one of the elements comprises an electronic circuit.

The configuration and the assembly of the present invention is particularly well suited to compensating heights (also called thicknesses) for example in the context of chip(s) mounted on a connection circuit in said assembly.

This is why, the subject of the invention is an assembly according to the invention comprising at least:

at least one component on the surface of said second element;

at least one first stack comprising at least one alternation of several intermediate metal interconnect elements and sintered joints;

at least one second stack in contact with said component comprising at least one intermediate metal interconnect element and at least one sintered joint;

the number of intermediate metal elements in said second stack being less than the number of intermediate metal interconnect elements in said first stack.

In variants of the assembly of the invention, the number of intermediate metal interconnect elements in contact with a bonding pad varies along the thickness of the electrical and mechanical interconnect means.

In variants of the assembly of the invention, the size of the intermediate metal interconnect elements varies along the thickness of the electrical and mechanical interconnect means.

The abovementioned two types of configurations make it possible in particular to obtain pyramidal structures in the electrical and mechanical interconnect means, making it possible to reinforce the stability thereof.

The assembly of the present invention can thus also comprise several components that can have different heights and whose height variations can be compensated by different numbers of intermediate metal interconnect elements and of joints.

According to variants of the invention, at least one of the elements is a ceramic substrate that can be of $Al_2O_3$ or of $Si_3N_4$ or of AlN and that can comprise at least one metal layer on one of its faces.

According to variants of the invention, the at least first bonding pad and/or the at least second bonding pad is (are) of silver or of gold or of copper.

According to variants of the invention, the at least second bonding pad is of aluminum, the at least first bonding pad being of silver or of gold or of copper. In effect, that makes it possible to perform the necessary sintering operation which cannot be performed on an aluminum bonding pad.

In the case of an assembly comprising at least one first intermediate metal interconnect element and at least one second intermediate metal interconnect element, thus insulating at least one first bonding pad from at least one sintered joint and at least one second bonding pad from said sintered joint, it is possible to have bonding pads of aluminum on at least one of the two elements. The assembly can thus comprise one at least second bonding pad of aluminum, and/or one at least first bonding pad of aluminum.

According to variants of the invention, the intermediate metal interconnect element is a pressed metal ball.

According to variants of the invention, the sintered joint is of silver or of gold or of copper or of an alloy of metals comprising two of the abovementioned metals.

According to variants of the invention, the sintered joint has a thickness of the order of a few microns, that can be between 1 micron and a few tens of microns.

According to variants of the invention, the intermediate metal interconnect element has a thickness of the order of several tens of microns, that can be between 10 microns and 100 microns.

According to variants of the invention, the assembly comprising several intermediate metal interconnect elements, at least a part of the interconnects comprising said joints and said intermediate metal interconnect elements have different heights of joints and/or of interconnect elements.

Another subject of the invention is a method for fabricating an assembly comprising:

at least one first element comprising at least one first electrical bonding pad;

at least one second element comprising at least one second electrical bonding pad;

electrical and mechanical interconnect means comprising at least one first intermediate metal interconnect element, said method comprising the following steps:

the production of at least one first intermediate metal interconnect element on at least one first bonding pad, the use of at least a paste or a film of metal microparticles or nanoparticles;

an operation of sintering of said paste or of said film of metal microparticles or nanoparticles, so as to produce a sintered joint stacked with at least said intermediate metal interconnect element;

the melting point of said first intermediate metal interconnect element being greater than the sintering temperature of said metal microparticles or nanoparticles.

According to variants of the invention, the method also comprises the production of at least one second intermediate metal interconnect element on at least one second bonding pad.

Advantageously in the context of the mounting of an element comprising a component to be assembled with at least one facing electrical bonding pad, the method comprises the production of at least one intermediate metal interconnect element on the surface of at least one previously produced sintered joint. That makes it possible to produce connection stacks that can comprise an alternation of sintered joints and of intermediate metal elements, the number of which varies to compensate the thickness of the component in the assembly, relative to the interconnects composed of sintered joints and of intermediate metal elements.

According to variants of the invention, the number of metal interconnect elements in contact with a sintered joint varies along the thickness of said electrical and mechanical interconnect means.

According to variants of the invention, the size of the intermediate metal interconnect elements in contact with a sintered joint varies along the thickness of said electrical and mechanical interconnect means.

According to variants of the invention, the sintering operation is performed at a low pressure less than or equal to 100 g/cm².

According to variants of the invention, the method also comprises the application of a first pressure on at least said first intermediate metal interconnect element, before the sintering operation.

According to variants of the invention, the intermediate metal interconnect element is produced on the surface of at least one electrical bonding pad, from a metal wire by forming a metal ball made integral to said electrical bonding pad by a thermosonic technique or by thermocompression.

According to variants of the invention, the intermediate element is a metal pillar, said metal pillar (possibly of copper) can be produced according to the conventional microelectronic methods using resin photolithography and the electrodeposition of copper to form metal pillars on substrates. The cutting of the substrate to obtain unitary parts (chips) can generally be done after the pillars have been obtained.

According to variants of the invention, the sintering operation is performed at a second pressure lower than said first pressure.

According to variants of the invention, the method comprises the following steps:
- the production of at least one first intermediate metal interconnect element on the surface of at least one first electrical bonding pad;
- the deposition of a paste of metal microparticles or nanoparticles on the surface of at least said first intermediate metal interconnect element;
- the positioning of at least one second electrical bonding pad facing at least said first electrical bonding pad to form an assembly comprising at least the first element and the second element;
- an operation of sintering of said paste so as to form at least one sintered metal joint.

According to variants of the invention, the method comprises the heating and the pressing of said first intermediate metal interconnect element placed in contact with a dry film of metal microparticles or nanoparticles that can be on the surface of a flexible support, leading to the penetration of a part of said first intermediate element into said dry metal film, to the breaking of said dry film and to the formation of at least one element of dry metal film of microparticles or nanoparticles on the surface of at least said intermediate interconnect element.

Another subject of the invention is an assembly obtained according to the fabrication method of the invention.

BRIEF DESCRIPTION OF THE DRAWINGS

The invention will be better understood and other advantages will become apparent on reading the following description given in a nonlimiting manner, and through the attached figures in which:

FIGS. 2a to 2f illustrate the main steps of a second exemplary method for fabricating a second variant assembly according to the invention, comprising second intermediate interconnect elements;

DETAILED DESCRIPTION

Figure 1A:
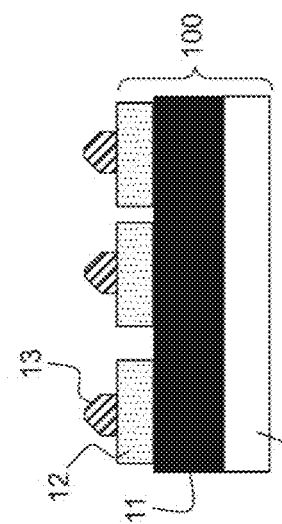
FIGS. 1a to 1f illustrate the main steps of a first exemplary method for fabricating an assembly according to the invention.

The subject of the present invention is an assembly and a method for fabricating an assembly making it possible to produce electrical interconnects that can operate at temperatures above 300° C. with a method temperature profile lower than 250° C. and very low pressures <100 g/cm².

It also makes it possible to compensate the height differences of intermediate electrical interconnect elements ranging up to several tens of μm.

It consists first of all in producing at least one intermediate electrical interconnect element.

The intermediate electrical connection element can typically be an element corresponding to a "stud bump", on a bonding pad of a first element that can typically be a circuit, or on the bonding pad of a second element that can typically comprise one or more semiconductor components, or both, the intermediate element being able to be obtained by thermosonic or thermocompression technique.

A pressure can then be applied to the intermediate connection element of "stud bump" type to deform it and in the case of several intermediate interconnect elements to make their height uniform.

The intermediate interconnect elements can be covered by paste of metal microparticles or nanoparticles by dispensing (quantity controlled without the use of masks).

The pads of the semiconductors are aligned with the corresponding circuit pads and a low pressure (<100 g/cm2) is applied to ensure a contact between the pads. A temperature cycle that makes it possible to sinter the paste of nanoparticles is then applied.

At the end of the method, an electrical and mechanical interconnect is assured between the semiconductor and the circuit.

This interconnect technique offers the following advantages:
- a low pressure for the sensitive components (compared to thermocompression);
- a high electrical and thermal conductivity compared to conventional soldering;
- the possibility of an assembly without flux and without mask simplifying the fabrication method;
- a joint height that can be adjusted by the "stud bumps" and the paste allows for a use of a wider variety of encapsulating materials because of the simplicity in filling the voids with greater heights (encapsulation material having greater viscosities and filled with larger particles) and a minimization of the thermomechanical stresses;
- a compatibility with different finishings of the pads used in microelectronics (Al, Au, Ag, Cu) for the interface with the intermediate interconnect elements that can be of "stud bump" type and finishings preferably of Au or Ag for the interface with the paste of nanoparticles of Ag;
- a compensation of a height difference of several tens of μm with the intermediate interconnect elements (by using bonding wires of different thicknesses, or by applying different pressures to the interconnect elements). Height differences less than ten or so μm can be compensated by the paste of metal nanoparticles;
- a low risk of short circuit between different bonding pads only about ten or so μm apart (compared to soldering, when the melting occurs) and the possibility of checking the electrical functionality (presence of short circuit or of open circuit) before the final assembly since the paste is solidified during the assembly method, contrary to soldering.

A first exemplary method for fabricating a first variant assembly according to the invention is described hereinbelow:

First step illustrated in FIG. 1a:
From a first element of DBC substrate type, 100, comprising a ceramic substrate 11, and a bottom metallic layer 10 and bonding pads 12, intermediate interconnect elements 13 are produced by thermosonics.
The bonding pads are produced with an Ni/Au (2 μm/50 nm) finishing layer.
With a "ball bonding" machine using a thermosonic technique known to the person skilled in the art, the intermediate interconnect elements 13 are produced.
The diameter of the Au wire used is 38 μm. The minimum size of the bonding pads 12 on which the intermediate interconnect elements will be produced must preferably be at least 2 times the bonding wire diameter.
A matrix of 7×7 intermediate interconnect elements is produced with a distance of 300 μm between two consecutive intermediate interconnect elements.
The so-called "bonding" conditions (temperature of the substrate, power and time of the ultrasounds, pressure applied) are optimized to obtain a shear strength of 80 g/intermediate interconnect element.

Figure 1B:
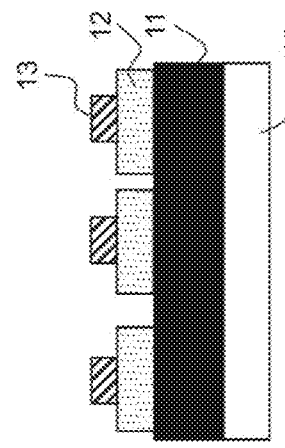

Second step illustrated in FIG. 1b:
The height of the intermediate interconnect elements is made uniform by applying a force of 100 g/intermediate interconnect element by a planar and rigid surface (glass or silicon). This force is sufficient to deform the intermediate interconnect elements and obtain an intermediate interconnect element height of 40 μm. The diameter of the pressed intermediate interconnect element is approximately 120 μm.

Figure 1C:
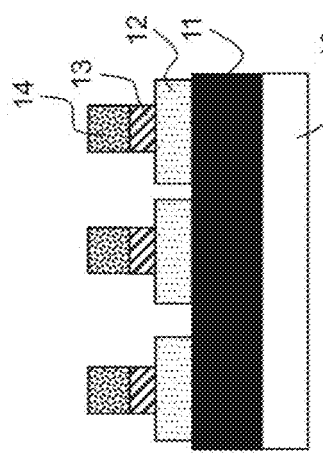

Third step illustrated in FIG. 1c:
A paste of silver nanoparticles is used to attach the intermediate interconnect elements produced on the DBC circuit to the finishing metal of the chip corresponding to the second element to be assembled (the finishing metal can typically be gold). A controlled quantity of the paste of nanoparticles 14 is deposited on the intermediate interconnect elements using a manual dispenser. The dispensing method can be conducted automatically using automatic dispensing machines present on the market (for example: ASYMTEK Quantum series).

Figure 1D:
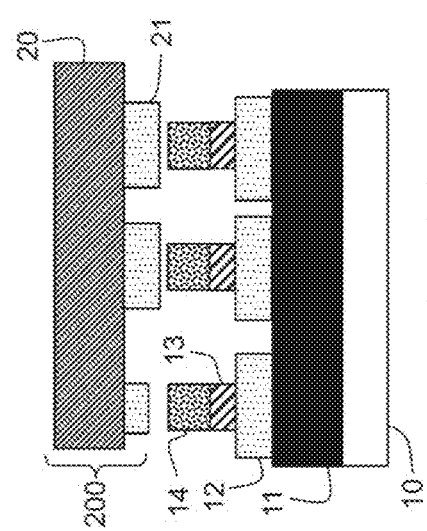

Fourth step illustrated in FIG. 1d:
A silicon chip 200 comprising a component 20 and a layer of an Ni/Au finishing 21 is then added by "flip chip" technique on the die of the circuit.

Figure 1E:
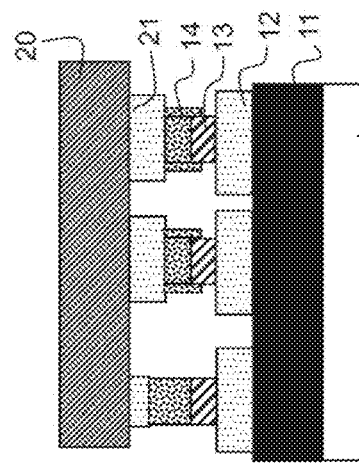

Fifth step illustrated in FIG. 1e:
A pressure of 100 g/cm$^2$ is applied to the chip to ensure the contact between the different pads 21, the paste elements 14 stacked previously on the intermediate interconnect elements 13 produced on the surface of the bonding pads 12 to produce the assembly of the circuit 100 and the chip 200.

Figure 1F:
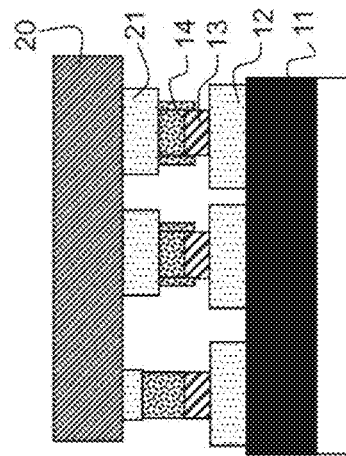

Sixth step illustrated in FIG. 1f:
A step of sintering of the paste containing silver nanoparticles is performed with a rise to 250° C. in air for 20 minutes with a controlled raising ramp (5° C./min). Following this step, all the organic materials forming the paste (solvent, binder, dispersant) are evaporated and the final joint is formed with just silver.

At the end of the method, a mechanical shear rigidity test is performed to test the mechanical rigidity of the joint. A force of 3 kg (average of 3 tests performed) is necessary to separate the chip, which amounts to an average force of 61 g/interconnect stack. The joint is detached at the interface between the sintered joint and the finishing of the chip which is the most critical interface in the present configuration. Typically, the sintered joint can have a thickness of between approximately 1 μm and 10 μm.

A second exemplary method for fabricating a second variant assembly comprising first and second intermediate electrical and mechanical interconnect elements according to the invention is described hereinbelow:

First step illustrated in FIG. 2a:
From a first element of DBC substrate type, 100, comprising a ceramic substrate 11, and a bottom metallic layer 10 and bonding pads 12, first intermediate interconnect elements 13 are produced by thermosonics.
In parallel, second intermediate interconnect elements 22 are also produced on a second element of silicon chip type 200 comprising a component 20 and a layer of an Ni/Au finishing 21 by thermosonics.

Second step illustrated in FIG. 2b:
The height of the intermediate interconnect elements 13 and 22 is made uniform by applying a force of 100 g/intermediate interconnect element by a planar and rigid surface (glass or silicon). This force is sufficient to deform the intermediate interconnect elements and obtain an intermediate interconnect element height of 40 μm. The diameter of the pressed intermediate interconnect element is approximately 120 μm.

Third step illustrated in FIG. 2c:
A paste of silver nanoparticles is used to attach the intermediate interconnect elements produced on the DBC circuit to the intermediate interconnect elements of the chip corresponding to the second element to be assembled (the finishing metal can typically be gold). A controlled quantity of the paste of nanoparticles 14 is deposited on the intermediate interconnect elements 13 using a manual dispenser. The dispensing method can be conducted automatically using automatic dispensing machines present on the market (for example: ASYMTEK Quantum series).

Fourth step illustrated in FIG. 2d:

The silicon chip 200 comprising a component 20, a layer of an Ni/Au finishing 21, intermediate interconnect elements 22, is then added by "flip chip" technique on the die of the circuit 100.

Fifth step illustrated in FIG. 2e:

A pressure of 100 g/cm² is applied to the chip to ensure the contact between the different pads 21, the intermediate interconnect elements 22, the paste elements 14 stacked previously on the intermediate interconnect elements 13 produced on the surface of the bonding pads 12 to produce the assembly of the circuit 100 and the chip 200.

Sixth step illustrated in FIG. 2f:

A step of sintering of the paste containing silver nanoparticles is performed with a rise to 250° C. in air for 20 minutes with a controlled rise ramp (5° C./min). Following this step, all the organic materials forming the paste (solvent, binder, dispersant) are evaporated and the final joint is formed with just silver.

Figure 3A:
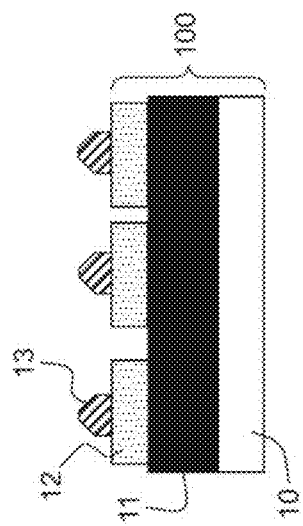
FIGS. 3a to 3f illustrate the main steps of a third exemplary method for fabricating an assembly according to the invention with the use of a dry film of metal nanoparticles.
Figure 3B:
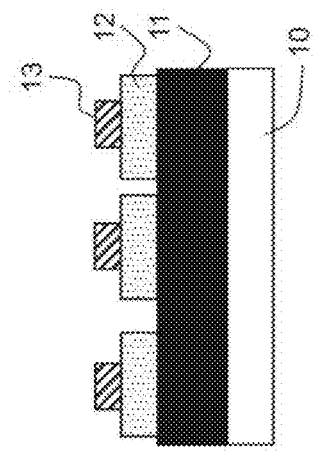

A third exemplary method for fabricating an assembly comprising first intermediate electrical and mechanical interconnect elements according to the invention is described hereinbelow:

The first and second steps of the method illustrated in FIGS. 3a and 3b are identical to those of the first exemplary method (illustrated in FIGS. 1a and 1b).

Figure 3C:
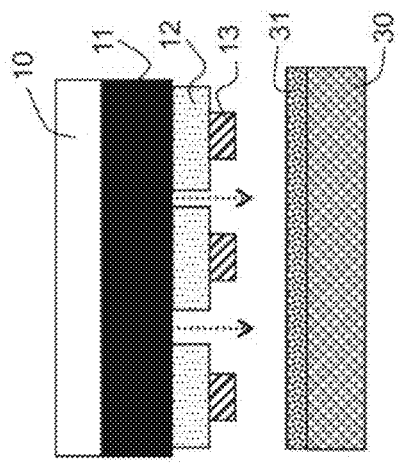
Figure 3D:
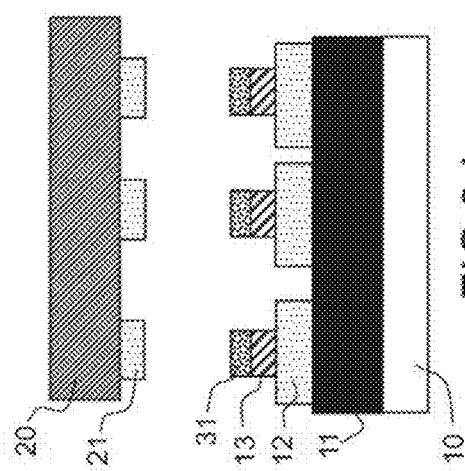

Third step illustrated in FIG. 3c and in FIG. 3d:

The first interconnect elements 13 on the surface of the first metal pads 12 are heated then pressed onto a dry metal film of microparticles or nanoparticles 31 which is placed on a flexible material forming the support 30. The temperature is of the order of 100° C. to activate the adhesion upon contact with the film. The height of the intermediate interconnect elements is chosen to be greater than the depth of penetration into the film, so that the bonding pads 12 are not in contact with said film.

The first intermediate interconnect elements penetrate several µm into the film and the surfaces of the dry film which are in contact with the interconnect element can be separated from the rest of the film, creating dry film elements 31 which adhere to the intermediate interconnect elements (for this, the adhesion force between the first element and the film is greater than that existing between the film and the flexible support), as illustrated in FIG. 3d. The film is thus in a way stamped onto the interconnect elements.

Figure 3E:
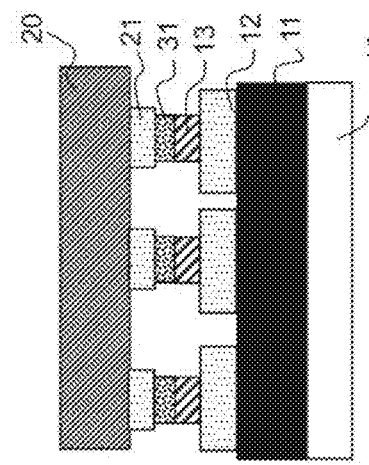

Fourth step illustrated in FIG. 3e:

A silicon chip comprising a component 20 and a layer of an Ni/Au finishing 21 is then added by "flip chip" technique onto the die of the circuit.

Figure 3F:
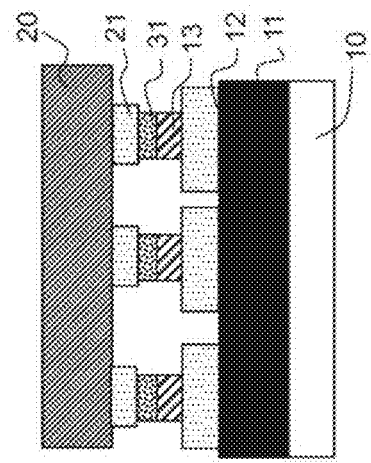

Fifth step and sixth step illustrated in FIG. 3f:

A pressure of 10 kg/cm² is applied to the chip to ensure the contact between the different pads 21, the film elements 31 previously stacked on the intermediate interconnect elements 13 produced on the surface of the bonding pads 12 to produce the assembly of the circuit 100 and the chip 200. A step of sintering of the film containing silver nanoparticles is performed with a rise to 250° C. in air for 20 minutes with a controlled rise ramp (5° C./min).

Figure 4A:
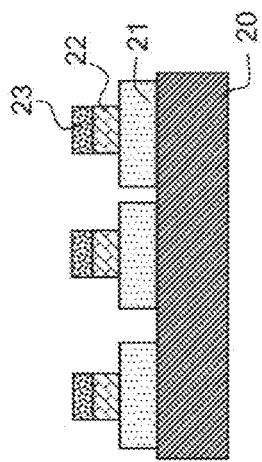
FIGS. 4a to 4e illustrate an exemplary method with the production of metal pillars.

A fourth exemplary method for fabricating an assembly comprising first intermediate electrical and mechanical interconnect elements of pillar type, according to the invention is described hereinbelow:

First step illustrated in FIG. 4a:

Pillars of copper 22 are produced on the surface of a silicon chip comprising a component 20 and a layer of an Ni/Au finishing 21 by conventional microelectronic methods using resin photolithography and electrodeposition of the copper to form metal pillars on substrates. The cutting of the substrate to obtain unitary pieces (chips) can be done generally after the pillars have been obtained.

Figure 4B:
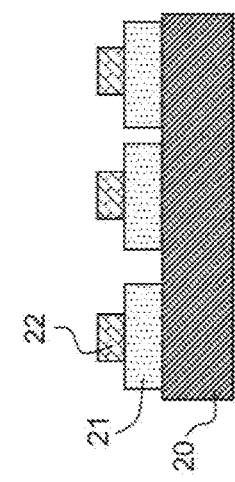

Second step illustrated in FIG. 4b:

The deposition of paste of nanoparticles is performed on the surface of the pillars previously created 22. A controlled quantity of the paste of metal nanoparticles 14 is deposited on the intermediate interconnect elements using a manual dispenser, so as to form the metal paste elements 23 intended to be sintered.

Figure 4C:
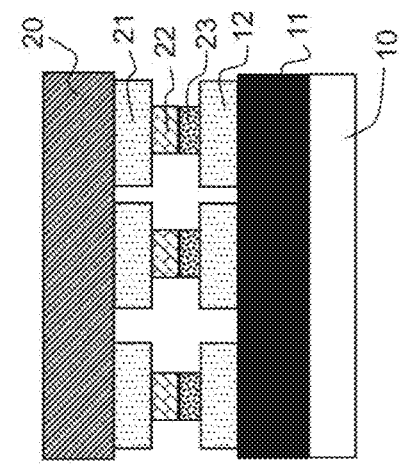

Third step illustrated in FIG. 4c:

The assembly previously created and described previously is added to a DBC substrate comprising a ceramic substrate 11, and a bottom metallic layer 10 and bonding pads 12.

Figure 4D:
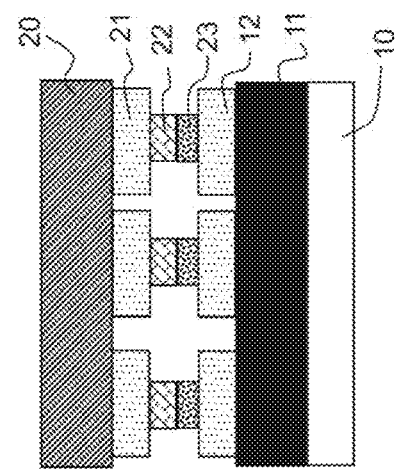

Fourth step illustrated in FIG. 4d:

A pressure of 100 g/cm² is applied to the chip to ensure the contact between the different pads 21, the intermediate interconnect elements 22, the paste elements 23 stacked on the bonding pads 12 to produce the assembly of the circuit and of the chip.

Figure 4E:
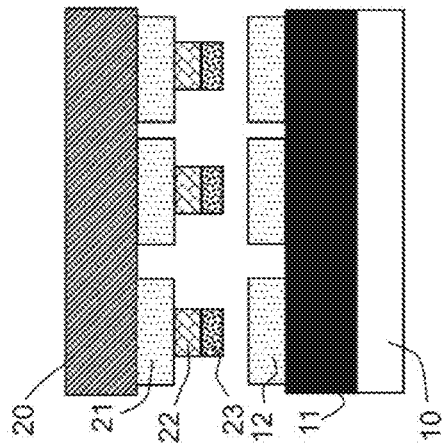

Fifth step illustrated in FIG. 4e:

A step of sintering of the paste containing silver nanoparticles is performed with a rise to 250° C. in air for 20 minutes with a controlled rise ramp (5° C./min). Following this step, all the organic materials forming the paste (solvent, binder, dispersant) are evaporated and the final joint is formed with just silver.

Figure 5A:
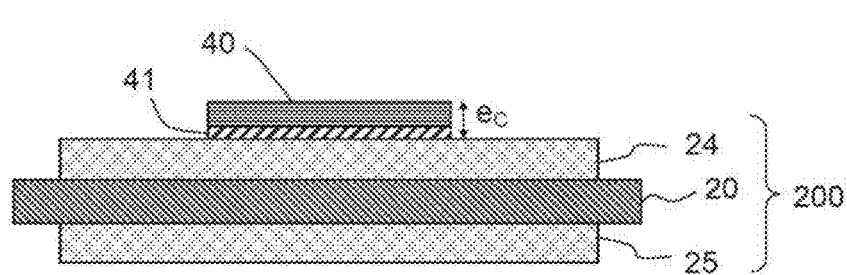
FIGS. 5a and 5b illustrate an example of assembly of the invention comprising a stack of an alternation of intermediate elements and of sintered joints making it possible to compensate the height of a chip in an assembly.

According to the present invention, it is particularly advantageous to assemble a chip on the surface of a "DBC" substrate, on another substrate comprising connection elements, by using a stack of several sintered joints and intermediate metal interconnect elements of metal ball type commonly called "bump". FIG. 5a thus illustrates a chip 40, linked via a joint 41 to a DBC substrate comprising a substrate 20 that can be ceramic, having a metal surface 24 and a metal surface 25.

Figure 5B:
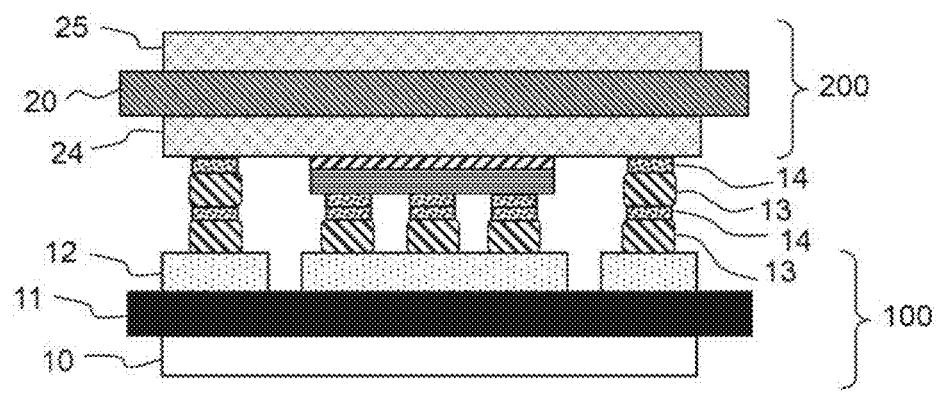

By using a stack of several levels of metal balls and of sintered joints, an assembly illustrated in FIG. 5b is obtained, comprising, from a substrate 11, covered by a metal surface 10 and metal elements 12, the following succession of elements at the periphery of the chip:
metal balls 13;
sintered joints 14;
metal balls 13;
sintered joints 14.
On the chip, the following stack is obtained:
metal balls 13;
sintered joints 14;
sintered joints 14.

The benefit of this type of stack is in particular compensating the thickness of the chip in the stack, this thickness $e_c$ being able to lie typically between 70 µm and 300 µm.

Typically, the thicknesses of the metal balls in the stack can have thicknesses of between 10 µm and 100 µm.

Figure 6A:
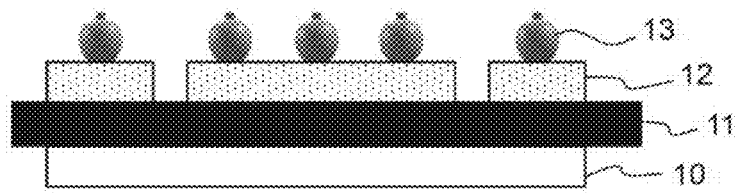
FIGS. 6a to 6h illustrate the steps of an exemplary method of the invention making it possible to produce the exemplary assembly illustrated in FIG. 5b.

Example of method for fabricating the assembly illustrated in FIG. 5b:

First step illustrated in FIG. 6a:

Intermediate interconnect elements 13 are produced on the surface of metal elements previously created 12 by thermosonic technique.

Figure 6B:
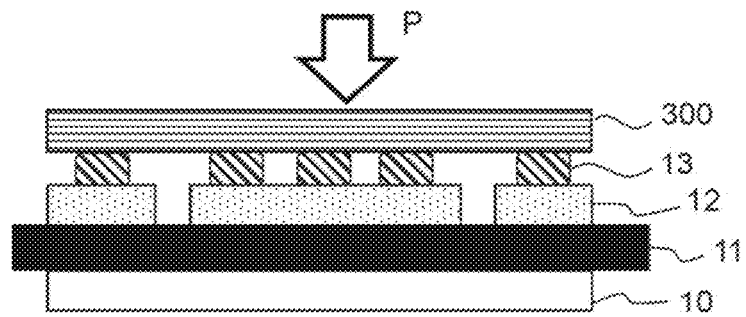

Second step illustrated in FIG. 6b:
The height of the intermediate interconnect elements 13 is made uniform by applying a pressure P that can be 100 g/intermediate interconnect element by a planar and rigid surface (glass or silicon) 300 (to within the flatness tolerance of the glass plate). This force is sufficient to deform the intermediate metal interconnect elements and obtain an intermediate interconnect element height of a thickness of between 10 μm and 100 μm.

Figure 6C:
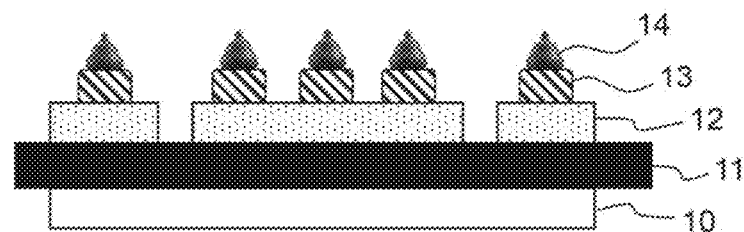

Third step illustrated in FIG. 6c:
A controlled quantity of paste of silver nanoparticles 14 is deposited on the intermediate metal interconnect elements 13 using a manual dispenser. The dispensing method can be conducted automatically using automatic dispensing machines present on the market (for example: ASYMTEK Quantum series).

Figure 6D:
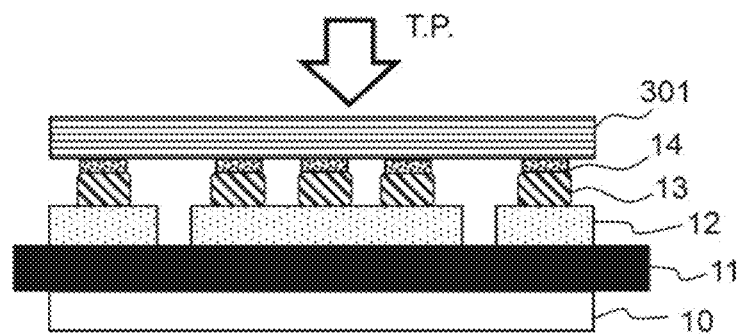

Fourth step illustrated in FIG. 6d:
The sintered joints 14 are produced, by a thermocompression operation T. P., on the surface of the metal balls 13, via an intermediate substrate 301.

Figure 6E:
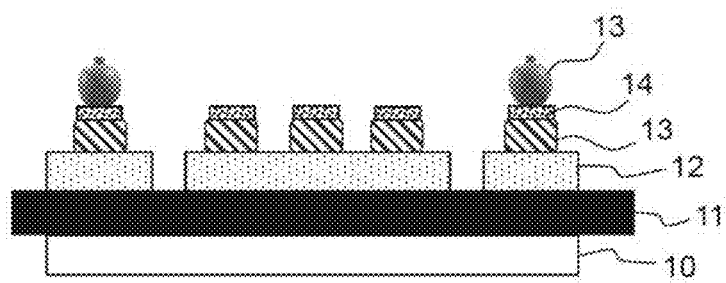

Fifth step illustrated in FIG. 6e:
A second level of metal balls 13 is produced on the surface of the sintered joints previously produced 14, by thermosonic technique.

Figure 6F:
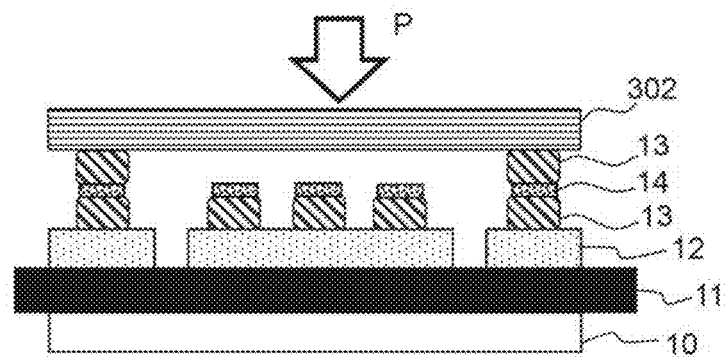

Sixth step illustrated in FIG. 6f:
The height of the intermediate metal interconnect elements 13 is made uniform by applying a pressure P that can be 100 g/intermediate interconnect element by a planar and rigid surface (glass or silicon) 302 (to within the flatness tolerance of the glass plate). This force is sufficient to deform the intermediate interconnect elements and obtain an intermediate interconnect element height of a thickness of between 10 μm and 100 μm.

Figure 6G:
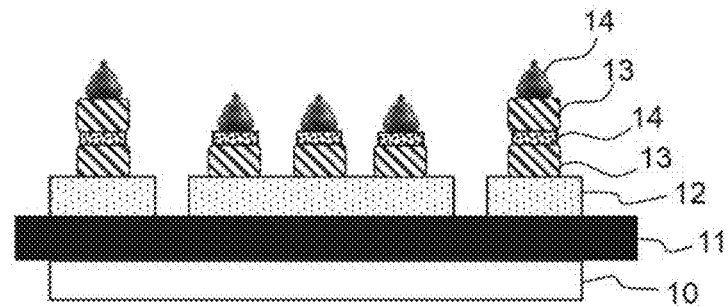

Seventh step illustrated in FIG. 6g:
A controlled quantity of paste of silver nanoparticles 14 is deposited on the intermediate interconnect elements 13 using a manual dispenser. The dispensing method can be conducted manually or automatically using automatic dispensing machines present on the market (for example: ASYMTEK Quantum series).

Figure 6H:
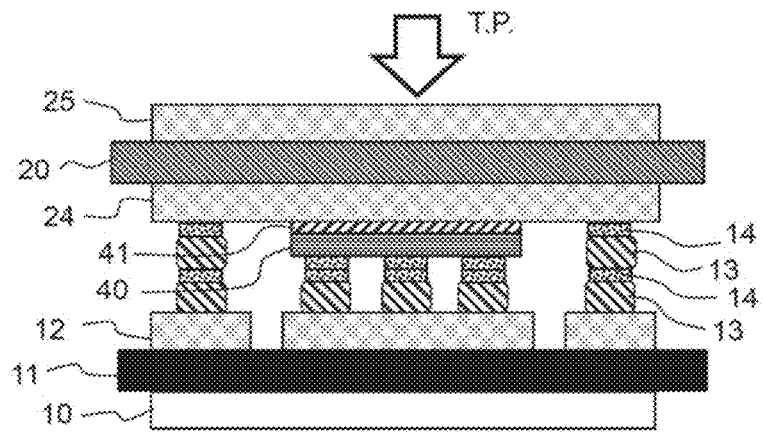

Eighth step illustrated in FIG. 6h:
The assembly of the chip is produced on the surface of its substrate with the assembly previously created and illustrated in FIG. 6g. FIG. 6h shows the different stacks.

At the periphery:
metal balls 13;
sintered joints 14;
metal balls 13;
sintered joints 14.
On the chip 40, a stack is obtained:
of metal balls 13;
of sintered joints 14;
of sintered joints 14.

This operation can be performed with a thermocompression machine that can have "z" control or a thermal mounting machine. This operation can be performed at low pressure or using a commercial paste to be sintered of "pressureless" type.

According to the invention, the densification of the sintered joint makes it possible to start from a planar surface to stack a second "bump". This configuration is much better than a stack of 2 "bumps" without sintering step.

Figure 7:
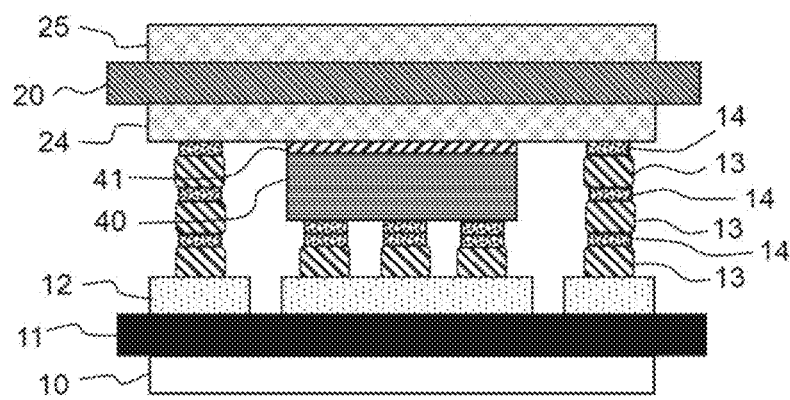
FIG. 7 illustrates a variant exemplary assembly comprising a stack of several intermediate elements and of several sintered joints.

This step can be repeated several times to achieve the desired thickness and an example of an assembly is illustrated in FIG. 7 which shows a stack produced in succession and comprising 3 levels of "bump" 13, two "bumps" being linked to one another via sintered joints 14, a sintered joint also linking the contact 24 to the substrate 20 supporting the chip 40.

Numerous variants make it possible to compensate significant thicknesses, up to 300 μm (difference in thickness between a component of 70 μm silicon insulated gate bipolar transistor "IGBT" type and a 300 μm SiC diode).

The different "bump" levels can in particular have "bumps" with different diameters or different numbers per sintered joint so as to ensure a more stable pyramidal structure.

Figure 8:
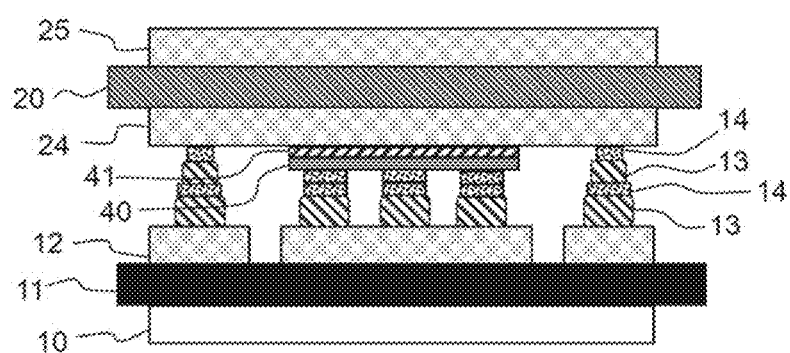
FIG. 8 illustrates a variant exemplary assembly comprising different sizes of intermediate elements in the stacks.

For example, FIG. 8 illustrates an example of an assembly in which two levels of "bumps" 13 have different "bump" diameters.

Example of method for fabricating an assembly having a structure of pyramidal type on intermediate metal interconnect elements and illustrated using FIGS. 9a to 9h.

Figure 9A:
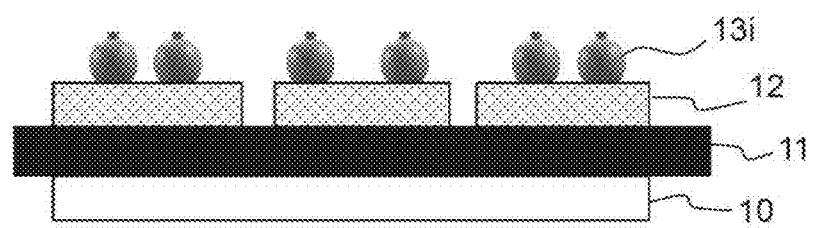
FIGS. 9a to 9h illustrate the steps of an exemplary method of the invention making it possible to produce an exemplary assembly comprising different numbers of intermediate metal interconnect elements, along the stacks: intermediate metal interconnect elements/sintered joint.

First step illustrated in FIG. 9a:
Intermediate metal interconnect elements 13i are produced on the surface of metal elements previously created 12 by thermosonic technique. According to this example, several interconnect elements 13i are produced on a metal element 12.

Figure 9B:
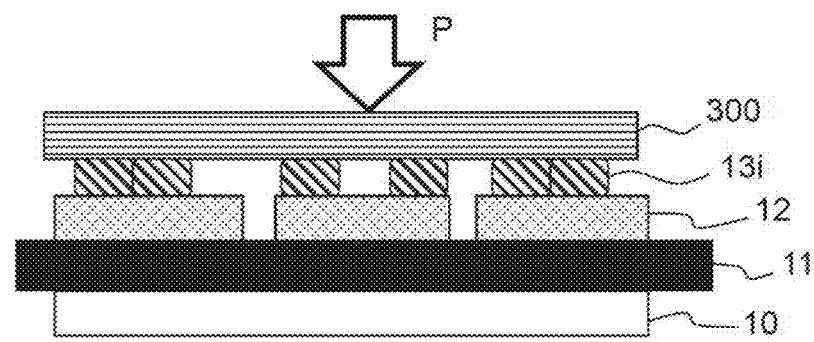

Second step illustrated in FIG. 9b:
The height of the intermediate interconnect elements 13i is made uniform by applying a pressure P that can be 100 g/intermediate interconnect element by a planar and rigid surface (glass or silicon) 300. This force is sufficient to deform the intermediate interconnect elements and obtain an intermediate interconnect element height of a thickness of between 10 μm and 100 μm.

Figure 9C:
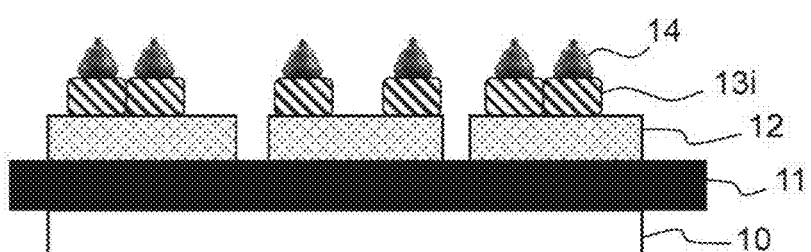

Third step illustrated in FIG. 9c:
A controlled quantity of paste of silver nanoparticles 14 is deposited on the intermediate interconnect elements 13i using a manual dispenser. The dispensing method can be conducted automatically using automatic dispensing machines present on the market (for example: ASYMTEK Quantum series).

Figure 9D:
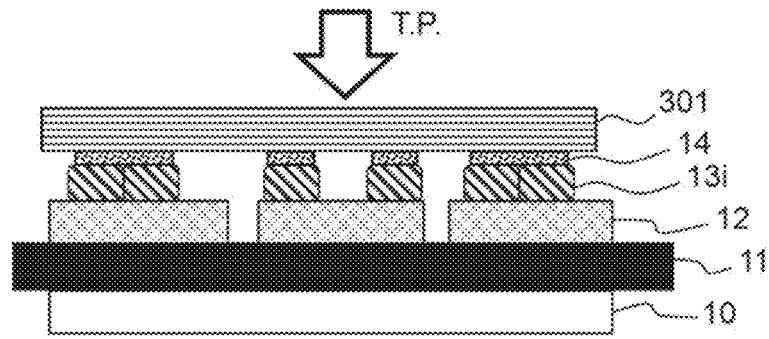

Fourth step illustrated in FIG. 9d:
The sintered joints 14 are produced, by a thermocompression operation T. P., on the surface of the metal balls 13i, via an intermediate substrate 301.

Figure 9E:
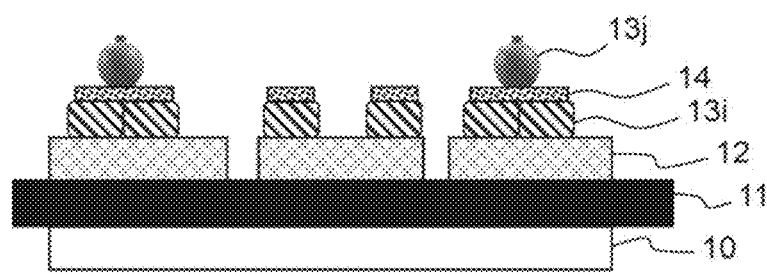

Fifth step illustrated in FIG. 9e:
A second level of metal balls 13j is produced on the surface of the sintered joints previously produced 14 by thermosonic technique.

Figure 9F:
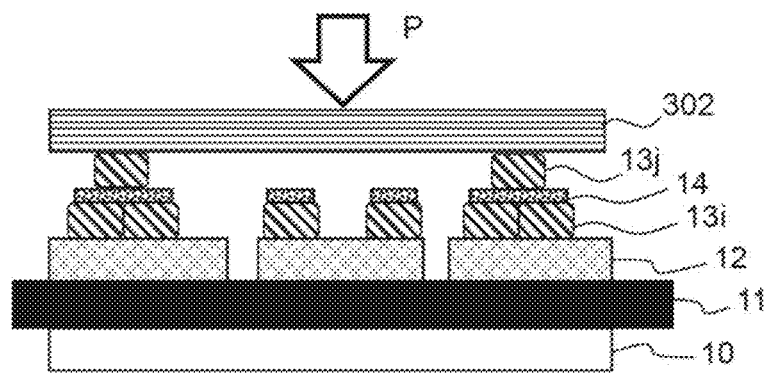

Sixth step illustrated in FIG. 9f:
The height of the intermediate interconnect elements 13j is made uniform by applying a pressure P that can be 100 g/intermediate interconnect element by a planar and rigid surface (glass or silicon) 302. This force is sufficient to deform the intermediate interconnect elements and obtain an intermediate interconnect element height of a thickness of between 10 μm and 100 μm.

Figure 9G:
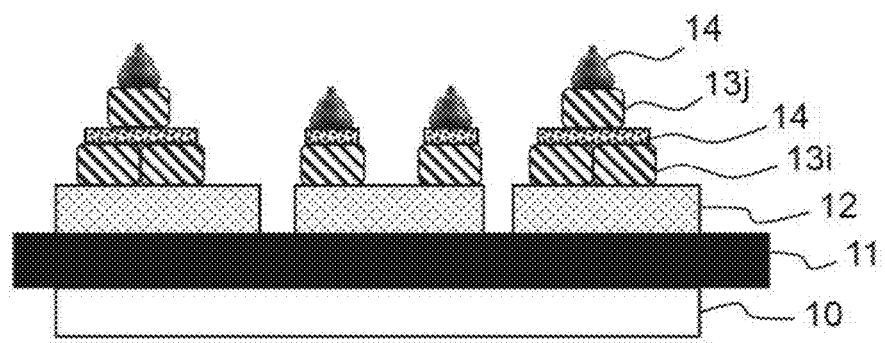

Seventh step illustrated in FIG. 9g:
A controlled quantity of paste of silver nanoparticles 14 is deposited on the intermediate interconnect elements 13j using a manual dispenser. The dispensing method can be conducted automatically using automatic dispensing machines present on the market (for example: ASYMTEK Quantum series).

Figure 9H:
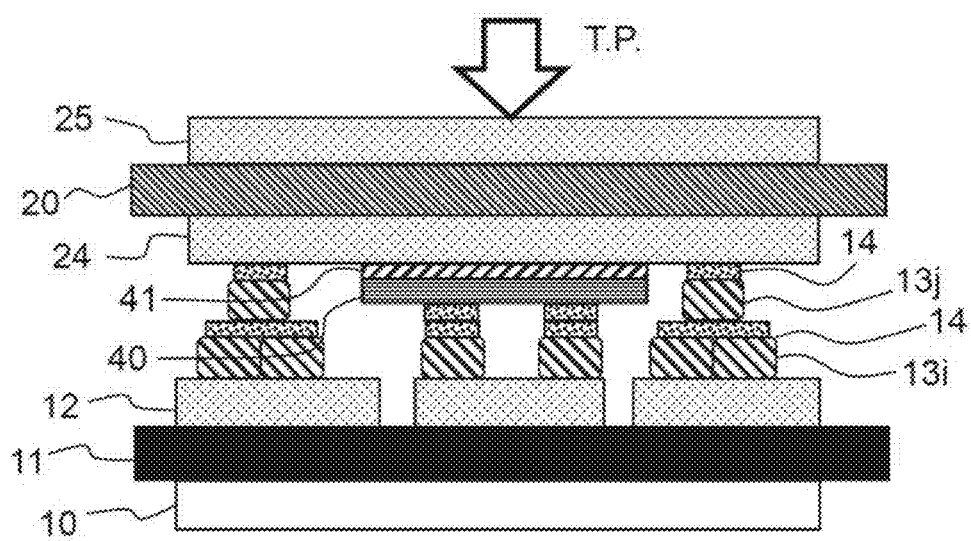

Eighth step illustrated in FIG. 9h:
The assembly of the chip is produced on the surface of its substrate with the assembly previously created and illustrated in FIG. 9g. FIG. 9h shows the different stacks.

At the periphery:
metal balls 13*i*;
sintered joints 14;
metal balls 13*j*;
sintered joints 14.
On the chip, the following stack is obtained:
metal balls 13*i*;
sintered joints 14;
sintered joints 14.

This operation can be performed at low pressure or by using a commercial paste to be sintered of "pressureless" type.

It should be noted that it is possible to produce a configuration of "pyramid" type from the two substrates (therefore also on the chip side).

It should also be noted that the height compensation can also be performed on the substrate on the chip side.

The Applicant has performed tests to assemble a component of HEMT (High Electron Mobility Transistor) GaN transistor type on a substrate of "DBC" type obtained according to the first exemplary method for fabricating an assembly illustrated in FIGS. 1*a* to 1*f*.

The tests conducted after the production of the assembly according to the invention have proven the quality of the assembly, the transient being perfectly functional.

The component has a gate height 10 µm less than that of the drain and source.

It was thus possible to produce interconnects with elements having matched and different heights.

Figures 10A, 10B:
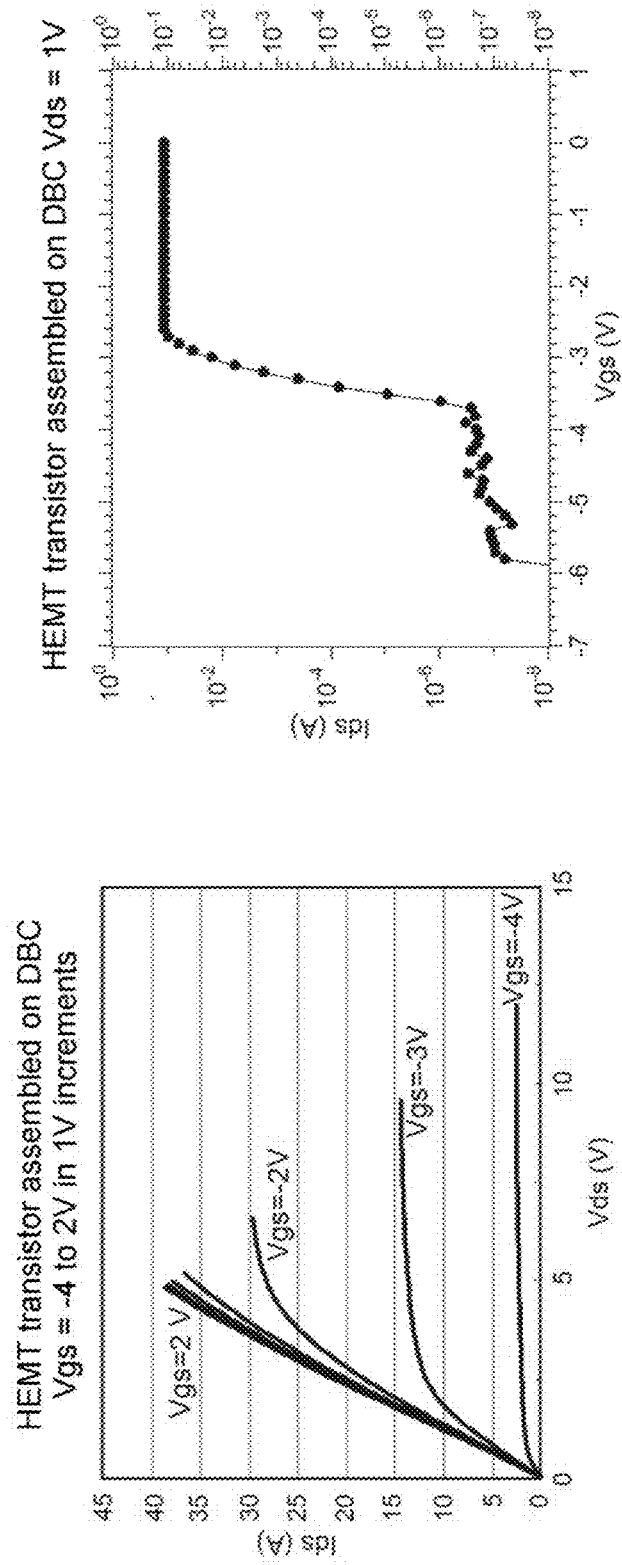
FIGS. 10a and 10b illustrate the electrical characteristics of a gallium nitride HEMT component assembled by "flip chip" on a circuit of DBC type.

The same interconnect is produced and electrical tests have shown a fully functional transistor as illustrated in FIGS. 10*a* and 10*b*. FIG. 10*a* represents the characteristics of the current Ids as a function of the voltage Vds (with the following references: d for drain and s for source) with a pulse time of 100 µs, of a GaN transistor with gate-source voltages Vgs between −4V (transistor off) and 2V, with 1V increments. FIG. 10*b* represents the variation of the current Ids as a function of the voltage Vgs for a drain-source voltage Vds of 1V showing the currents Ids when the transistor is off and on.

Compared to a conventional solder or a conductive glue, the sintering of silver nanoparticles offers several advantages such as a better thermal conductivity (more than 4 times greater than that obtained with conventional solders), a method temperature lower than 300° C. and an operating temperature greater than 300° C. (in the case of the solder, the temperature of the method is greater than the operating temperature). The technique used makes it possible to avoid the short circuits that can occur in the melting of the solder.

Furthermore, the porous joint between the intermediate interconnect element and the pad of the semiconductor makes it possible to better absorb the mechanical constraints induced by the difference in the thermal expansion coefficients between the assembled components during thermal cycles.

It should be noted that the height of the intermediate interconnect elements can be controlled and made uniform by applying a pressure that is sufficient to deform them.

Different intermediate interconnect element heights can be envisaged on one and the same substrate by:
producing a first series with the shortest elements then by pressing them with an appropriate pressure;
by making a series of higher elements then pressing them.

This height of the intermediate interconnect elements can be controlled by the diameter of the wires, the deformation pressure exerted or through the production of "multiple intermediate interconnect elements". These multi-height intermediate interconnect elements are necessary if the surface profile exhibits a height variation of several tens of µm which cannot be compensated by the paste alone.

In the present invention, "stud bump" intermediate interconnect elements of Au can be produced. Intermediate interconnect elements can also be produced by using other metals or alloys (Cu, Ag, Ag alloy). The intermediate interconnect elements can be pressed to have a controlled height with a variation less than a µm. It is however possible not to press the "stud bumps" formed, potentially generating a height variation of approximately 1 to 5 µm.

The paste of microparticles or nanoparticles can be silver or gold or copper or copper/silver alloy.

It should be noted that, in the case of sintering of microparticles, it is appropriate to use stronger pressures, typically being able to be greater than 20 MPa.

The deposition of the paste of nanoparticles can be performed using a dispenser. Other paste depositing solutions can be considered such as the deposition by screen printing or direct imprint, that makes it possible to have the paste in very localized zones.

The invention claimed is:

1. An assembly comprising:
at least one first element comprising at least one first electrical bonding pad;
at least one second element comprising at least one second electrical bonding pad or a surface metallization;
electrical and mechanical interconnect means, wherein said electrical and mechanical interconnect means comprise at least: at least one first intermediate metal interconnect element, on the surface of at least the first electrical bonding pad;
at least one sintered joint of metal microparticles or nanoparticles stacked with said first intermediate metal interconnect element; the melting point of said first intermediate metal interconnect element being greater than the sintering temperature of said metal microparticles or nanoparticles;
at least one component on the surface of said second element;
at least one first stack comprising at least one alternation of a plurality of first stack intermediate metal interconnect elements including said first intermediate metal interconnect element and first stack sintered joints; and
at least one second stack in direct contact with said component, comprising at least one second stack intermediate metal interconnect element and at least one second stack sintered joint, wherein a number of second stack intermediate metal interconnect elements in said second stack being less than a number of the first stack intermediate metal interconnect elements in said first stack.

2. The assembly as claimed in claim 1, further comprising at least one second intermediate metal interconnect element, on the surface of at least the second electrical bonding pad.

3. The assembly as claimed in claim 2, in which the at least second bonding pad is of aluminum, and/or the at least first bonding pad is of aluminum.

4. The assembly as claimed in claim 1, in which at least one of the elements comprises a semiconductor component.

5. The assembly as claimed in claim 1, in which at least one of the elements comprises an electronic circuit.

6. The assembly as claimed in claim 1, in which the number of intermediate metal interconnect elements in contact with said first at least one sintered joint varies along the thickness of said electrical and mechanical interconnect means.

7. The assembly as claimed in claim 1, in which, the size of the intermediate metal interconnect elements in contact with said first at least one sintered joint varies along the thickness of said electrical and mechanical interconnect means.

8. The assembly as claimed in claim 1, in which at least one of the elements is a ceramic substrate comprising any of $Al_2O_3$ or of $Si_3N_4$ or of AlN or of at least one metal layer on one of its faces.

9. The assembly as claimed in claim 1, in which any of said first or second electrical bonding pads is of silver or of gold or of copper.

10. The assembly as claimed in claim 1, in which the at least one first intermediate metal interconnect element is a pressed metal ball.

11. The assembly as claimed in claim 1, in which said first at least one sintered joint is of silver or of gold or of copper or of an alloy of metals comprising two of the abovementioned metals.

12. The assembly as claimed in claim 1, in which said first at least one sintered joint has a thickness of 1 micron or higher.

13. The assembly as claimed in claim 1, wherein said at least one first intermediate metal interconnect element has a thickness in a range from 10 microns to 100 microns.

14. The assembly as claimed in claim 1, comprising a plurality of intermediate metal interconnect elements including the at least one first intermediate metal interconnect element, the plurality of first stack intermediate metal interconnect elements, and the at least one second stack intermediate metal interconnect and in which, at least a part of the first and second stack intermediate metal interconnect elements comprising any of said joints including the at least one sintered joint, the first stack sintered joint, and the at least one second stack sintered joint and said plurality of intermediate metal interconnect elements have different heights with respect to each other.

* * * * *